(12) United States Patent
Kaki et al.

(10) Patent No.: US 8,001,319 B2
(45) Date of Patent: Aug. 16, 2011

(54) SEMICONDUCTOR STORAGE DEVICE

(75) Inventors: Kenichi Kaki, Yokohama (JP); Kunihiro Katayama, Yokohama (JP); Takashi Tsunehiro, Ebina (JP)

(73) Assignee: Solid State Storage Solutions, Inc., Marshall, TX (US)

( * ) Notice: Subject to any disclaimer, the term of this patent is extended or adjusted under 35 U.S.C. 154(b) by 0 days.

(21) Appl. No.: 12/466,907

(22) Filed: May 15, 2009

(65) Prior Publication Data
US 2009/0228643 A1 Sep. 10, 2009

Related U.S. Application Data

(63) Continuation of application No. 10/784,995, filed on Feb. 25, 2004, which is a continuation of application No. 10/387,478, filed on Mar. 14, 2003, now Pat. No. 6,728,826, which is a continuation of application No. 09/879,960, filed on Jun. 14, 2001, now Pat. No. 6,549,974, which is a continuation of application No. 09/706,843, filed on Nov. 7, 2000, now Pat. No. 6,457,092, which is a continuation of application No. 09/006,486, filed on Jan. 13, 1998, now Pat. No. 6,145,050, which is a continuation of application No. 08/669,914, filed on Jun. 25, 1996, now Pat. No. 5,809,515, which is a continuation of application No. 08/079,550, filed on Jun. 22, 1993, now Pat. No. 5,530,828, application No. 12/466,907, filed on May 15, 2009, which is a continuation of application No. 10/387,478, which is a continuation of application No. 10/132,322, filed on Apr. 26, 2002, now Pat. No. 6,598,115, which is a continuation of application No. 09/706,843, filed on Nov. 7, 2000, now Pat. No. 6,457,092, which is a continuation of application No. 09/006,486, filed on Jan. 13, 1998, now Pat. No. 6,145,050, which is a continuation of application No. 08/669,914, filed on Jun. 25, 1996, now Pat. No. 5,809,515, which is a continuation of application No. 08/079,550, filed on Jun. 22, 1993, now Pat. No. 5,530,828.

(30) Foreign Application Priority Data

Jun. 22, 1992 (JP) ..................................... 4-163074

(51) Int. Cl.
*G06F 12/08* (2006.01)
(52) U.S. Cl. ............ 711/103; 711/5; 711/100; 711/154; 711/166; 711/168
(58) Field of Classification Search .............. 711/5, 100, 711/103, 154, 166, 168; 710/46, 220
See application file for complete search history.

(56) References Cited

U.S. PATENT DOCUMENTS
4,563,752 A  1/1986 Pelgrom et al.
(Continued)

FOREIGN PATENT DOCUMENTS
DE            3200872          7/1983
(Continued)

OTHER PUBLICATIONS
Hitachi IC Memory Data Book, Mar. 1989, pp. 65-72 & 746-751.
(Continued)

*Primary Examiner* — Midys Rojas
(74) *Attorney, Agent, or Firm* — Antonelli, Terry, Stout & Kraus, LLP.

(57) ABSTRACT

A semiconductor storage apparatus is coupled with a system bus to receive a write request accompanied with first and second blocks of data, which are stored in nonvolatile semiconductor memories. A control device sends a first erase command to one of the nonvolatile memories to initiate a first internal erase operation of data within the nonvolatile memories. After the first erase command has been sent, the control device sends a second erase command to another one of the nonvolatile memories, to initiate a second internal erase operation of data within the other nonvolatile memory.

17 Claims, 8 Drawing Sheets

U.S. PATENT DOCUMENTS

| | | |
|---|---|---|
| 4,660,106 A | 4/1987 | Harrison et al. |
| 4,803,554 A | 2/1989 | Pape |
| 4,899,272 A | 2/1990 | Fung et al. |
| 4,924,375 A | 5/1990 | Fung et al. |
| 5,043,940 A | 8/1991 | Harari |
| 5,053,990 A | 10/1991 | Kreifels et al. |
| 5,065,364 A | 11/1991 | Atwood et al. |
| 5,172,338 A | 12/1992 | Mehrotra et al. |
| 5,198,380 A | 3/1993 | Harari |
| 5,222,046 A | 6/1993 | Kreifels |
| 5,245,572 A | 9/1993 | Kosonocky |
| 5,263,003 A | 11/1993 | Cowles et al. |
| 5,267,218 A | 11/1993 | Elbert |
| 5,268,870 A | 12/1993 | Harari |
| 5,270,979 A | 12/1993 | Harari et al. |
| 5,280,447 A | 1/1994 | Hazen et al. |
| 5,295,255 A | 3/1994 | Malecek et al. |
| 5,297,029 A | 3/1994 | Nakai et al. |
| 5,297,148 A | 3/1994 | Harari et al. |
| 5,315,541 A | 5/1994 | Harari et al. |
| 5,341,339 A | 8/1994 | Wells |
| 5,341,489 A | 8/1994 | Heiberger |
| 5,359,569 A | 10/1994 | Fujita et al. |
| 5,386,539 A | 1/1995 | Nishi |
| 5,388,248 A * | 2/1995 | Robinson et al. ............... 365/52 |
| 5,396,468 A | 3/1995 | Harari et al. |
| 5,418,752 A | 5/1995 | Harari et al. |
| 5,428,621 A | 6/1995 | Mehrotra et al. |
| 5,430,859 A | 7/1995 | Norman et al. |
| 5,437,020 A | 7/1995 | Wells et al. |
| 5,471,478 A | 11/1995 | Mangan et al. |
| 5,504,760 A | 4/1996 | Harari et al. |
| 5,519,843 A | 5/1996 | Moran et al. |
| 5,530,828 A | 6/1996 | Kaki et al. |
| 5,532,962 A | 7/1996 | Auclair et al. |
| 5,542,076 A * | 7/1996 | Benson et al. ............... 710/260 |
| 5,544,356 A | 8/1996 | Robinson et al. |
| 5,602,987 A | 2/1997 | Harari et al. |
| 5,663,901 A | 9/1997 | Wallace et al. |
| 5,664,145 A | 9/1997 | Apperley et al. |
| 5,689,676 A | 11/1997 | Hirose et al. |
| 5,724,544 A * | 3/1998 | Nishi ............... 711/115 |
| 5,764,571 A | 6/1998 | Banks |
| 5,778,418 A | 7/1998 | Auclair et al. |
| 5,809,515 A | 9/1998 | Kaki et al. |
| 6,145,050 A | 11/2000 | Kaki et al. |
| 6,230,233 B1 | 5/2001 | Lofgren et al. |
| 6,434,034 B1 | 8/2002 | Wallace et al. |
| 6,457,092 B1 | 9/2002 | Kaki et al. |
| 6,549,974 B2 | 4/2003 | Kaki et al. |
| 6,826,113 B2 | 11/2004 | Ellis et al. |
| 2004/0167653 A1 | 8/2004 | Kaki et al. |

FOREIGN PATENT DOCUMENTS

| | | |
|---|---|---|
| GB | 2 251323 | 7/1992 |
| GB | 2251324 | 7/1992 |
| JP | 62-36799 | 2/1987 |
| JP | 63-288384 | 11/1988 |
| JP | 1-235075 | 9/1989 |
| JP | 02 037443 | 2/1990 |
| JP | 2-62687 | 3/1990 |
| JP | 2-063389 | 3/1990 |
| JP | 02-114313 | 4/1990 |
| JP | 02-189790 | 7/1990 |
| JP | 02-289997 | 11/1990 |
| JP | 2-149165 | 12/1990 |
| JP | 2-292798 | 12/1990 |
| JP | 2-304614 | 12/1990 |
| JP | 03-025798 | 2/1991 |
| JP | 03-030034 | 2/1991 |
| JP | 3-252993 | 11/1991 |
| JP | 03-283094 | 12/1991 |
| JP | 4-33029 | 2/1992 |
| JP | 4-57295 | 2/1992 |
| JP | 04-084216 | 3/1992 |
| JP | 04-137078 | 5/1992 |
| JP | 04-163074 | 6/1992 |
| JP | 04-243096 | 8/1992 |
| JP | 92-18928 | 10/1992 |
| JP | 5-27924 | 2/1993 |
| JP | 5-027924 | 2/1993 |
| JP | 5-028039 | 2/1993 |
| JP | 5-204561 | 8/1993 |
| JP | 5-241741 | 9/1993 |
| JP | 05-242688 | 9/1993 |
| JP | 5-324000 | 12/1993 |
| JP | 06-202942 | 7/1994 |
| JP | 3328321 B2 | 7/2002 |
| JP | 4158934 B2 | 7/2008 |
| JP | 4382131 B2 | 10/2009 |
| WO | WO 9218928 | 10/1992 |

OTHER PUBLICATIONS

Eli Harari "Semiconductor Device Employing Flash EEPROM, Optimization to be Used for an External Storage Device for Small-Sized Personal Computer," Nikkei Electronics, Nikkei BP Inc. Feb. 17, 1992, No. 547, pp. 155-168.

Eli Harari "Semiconductor Disk Device Using a Flash EEPROM, Optimizing for the External Storage of Small Sized PC," Nikkei Electronics, Japan, Nikkei BP, Feb. 17, 1992, No. 547, pp. 1555-1568.

Yoshi Tokushige et al., "Future Vision of NAND Type EEPROM, Enlarging the Capacity by Twice in a year and Producing an Exclusive Device with 64M in 1994," Nikkei Electronics, Nikkei BP Inc. Feb. 17, 1992, No. 547, pp. 169-186.

* cited by examiner

FIG. 3

| MANAGE-MENT NO. | WRITE BUFFER MEMORY | FLASH MEMORIES (PHYSICAL SECTOR NOS.) | | COUNTER |
|---|---|---|---|---|
| | BLOCK NO. | CHIP NO. | SECTOR NO. | |
| 0 | 1 | 0 | 3 | 0 |
| 1 | 2 | 1 | 2 | 0 |
| 2 | 3 | 2 | 7 | 0 |
| 3 | 0 | 0 | 0 | 0 |
| ⋮ | ⋮ | ⋮ | ⋮ | ⋮ |

SEMICONDUCTOR STORAGE DEVICE

CROSS-REFERENCE TO RELATED APPLICATIONS

This application is a continuation of application Ser. No. 10/784,995, filed Feb. 25, 2004, which, in turn, is a continuation of application Ser. No. 10/387,478, filed Mar. 14, 2003, now U.S. Pat. No. 6,728,826, which, in turn, is a continuation of application Ser. No. 09/879,960, filed Jun. 14, 2001, now U.S. Pat. No. 6,549,974, which, in turn, is a continuation of Ser. No. 09/706,843, filed on Nov. 7, 2000 (now U.S. Pat. No. 6,457,092), which, in turn, is a continuation of Ser. No. 09/006,486, filed on Jan. 13, 1998 (now U.S. Pat. No. 6,145,050), which, in turn, is a continuation of application Ser. No. 08/669,914 filed on Jun. 25, 1996 (now U.S. Pat. No. 5,809,515), which, in turn, is a continuation of application Ser. No. 08/079,550, filed Jun. 22, 1993 (now U.S. Pat. No. 5,530,828); and the entire disclosures of which are hereby incorporated by reference. In addition, as another line of copendency, the present application is a continuation of application Ser. No. 10/387,478, filed Mar. 14, 2003, now U.S. Pat. No. 6,728,826, which, in turn, is a continuation of application Ser. No. 10/132,322, filed Apr. 26, 2002, now U.S. Pat. No. 6,598,115, which, in turn, is a continuation of Ser. No. 09/706,843, filed on Nov. 7, 2000 (now U.S. Pat. No. 6,457,092), which, in turn, is a continuation of Ser. No. 09/006,486, filed on Jan. 13, 1998 (now U.S. Pat. No. 6,145,050) which, in turn, is a continuation of application Ser. No. 08/669,914, filed on Jun. 25, 1996 (now U.S. Pat. No. 5,809,515), which, in turn, is a continuation of application Ser. No. 08/079,550, filed Jun. 22, 1993 (now U.S. Pat. No. 5,530,828), the entire disclosures of which are hereby incorporated by reference.

BACKGROUND OF THE INVENTION

1. Field of the Invention

The present invention relates to a semiconductor storage device employing flash memories. More particularly, it relates to a technique for continuously writing data into a semiconductor disk pack or the like which employs flash memories.

2. Description of the Related Art

A flash EEPROM (electrically erasable programmable read-only memory) is adapted to read out data therefrom and write data thereinto in word units with one word consisting of a plurality of bits, and to electrically erase data therefrom in chip units or in plural-word units. With respect to known art, there is a storage device, a. g., a disk pack wherein a plurality of such flash EEPROM's are packaged, and wherein data are written into the flash EEPROM's or erased therefrom in succession.

The prior art will be explained in conjunction with FIGS. 8(a)-8(g) which are illustrative of timing waveforms for the operation of writing data into a flash memory in accordance with a known command control system. Symbol Vcc in the figure denotes the power supply voltage of the flash memory, and +5V is normally applied as this voltage Vcc. Symbol Vpp denotes a writing supply voltage, which is a potential higher than the power supply voltage Vcc and which is applied in the mode of writing data into the flash memory. Addresses serve to designate the data writing areas of the flash memory in byte units. An output enable signal OE is set at a "low" level in the mode of reading data out of the flash memory, whereas it is set at a "high" level in any other mode. A chip enable signal CE is set at a "low" level in the mode of reading a command and data out of or writing a command and data into the flash memory. The chip enable signal CE in this flash memory is used also as a write enable signal, and the data are written at the rising or leading edge of this signal CE under the conditions of the high potential of the writing supply voltage Vpp and the high level of the output enable signal OE. Symbol I/O7 and symbols I/O0~I/O6 indicate signals on data lines. Next, the operation of writing 1 byte of data into the flash memory will be explained. First, the command on each data line is written into the flash memory at the rising edge of the chip enable signal CE. The command is a write setup command which notifies the start of the 1-word data writing operation to the flash memory. After the command has been written, the data on each data line is written into the flash memory at the rising edge of the chip enable signal CE. The "low" duration of the chip enable signal CE in the case of writing the command and the data is 50 nanosec. or more. In actuality, however, the operation of writing the data into a memory chip has just begun within the flash memory, and the next data cannot be written until the end of the internal writing operation. Here, a time period of several microsec.~several tens microsec. is expended on the internal writing operation within the flash memory, and it is considerably long compared with the time period, i.e., the actual time used, for writing the command and the data of one word. In this regard, status polling can be utilized as an expedient for checking if the writing operation within the flash memory chip has ended after the lapse of the time period of several microsec.~several tens microsec. The status polling determines the end of the writing operation within the memory chip in such a way that the status of the data line I/O7 is read out by holding the signals CE and OE "low".

The above technique requires a considerable time period in the case of continuously writing the data of a plurality of words. The command and the data of one word can be written in a time period on the order of several tens nanosec.~several hundred nanosec. However, a time period of several microsec.~several tens microsec. is expended from the time data of one word is initially fed to the flash memory until the end of the writing operation within the flash memory chip, and the flash memory cannot be accessed in the meantime. Therefore, the total time period for writing data of one word is considerably longer than a time period for reading out data of one word. Moreover, in the case of continuously writing data of the plurality of words, the writing time period increases in proportion to the number of words. By way of example, in a case where a semiconductor disk pack is constructed using such flash memories, data of several kilowords~several tens kilowords or more are continuously written. Then, the writing time period increases in proportion to the quantity of the data to-be-written, so that the transfer of the data which are to be written becomes slow, and this affects the whole system.

SUMMARY OF THE INVENTION

It is accordingly an object of the present invention to provide a semiconductor storage device which shortens a time period for writing data.

In order to accomplish this object, in one aspect of the present invention, a semiconductor storage device comprises a plurality of flash memories which store data therein; and control means for sending a first instruction of writing the data to one of the flash memories, and for sending a second write instruction to another of the flash memories different from the flash memory to which the first write instruction has been sent and which is under a write operation, before the flash memory to which the first instruction has been sent becomes capable of accepting a next write instruction.

Each of the flash memories is slower in the data writing operation than in a data reading operation. Nevertheless, since the control means sends the write instructions to the different flash memories in succession, a large amount of continuous data can be written at high speed when the storage device is considered overall.

BRIEF DESCRIPTION OF THE DRAWINGS

FIG. 3 is a diagram showing a write management table for use in the present invention;

PREFERRED EMBODIMENTS OF THE INVENTION

According to the present invention, in the case of writing continuous data, the write operation is so controlled that the data are not continuously written into an identical flash memory, but that they are written into different flash memories.

The flash memory into which the data of one word have been written inevitably involves a latency time period or waiting time of several microsec.~several tens microsec. before the next data are written thereinto. Therefore, in the presence of data which are to be continuously written, data of each additional word are continuously written into a different flash memory than that associated with the preceding word during the latency time period of the flash memory of the preceding word. When the latency time period of the flash memory initially subjected to the write operation has lapsed, status polling is started from the first flash memory, and the next data of one word are written into this flash memory upon acknowledging the status thereof.

More specifically, the status polling in an example proceeds as stated below. A processor 2 (to be explained later) receives data of 8 bits from that one of a plurality of flash memory chips in which the data of one word have been written. When bit #7 of the received data of 8 bits has a value which is a logically inverted value of the written data of this bit #7, the processor determines that the operation of writing the data into the flash memory chip has ended.

The status polling also serves to determine whether the flash memory chip has become defective. By way of example, when the above status indicating the end of the write operation is not acknowledged, the status polling is performed every 6 microsec. Unless the status is acknowledged after iterating the status polling 20~30 times, the chip is determined to be defective.

Incidentally, regarding the operation of erasing data, the status polling is utilized in order to determine completion of the erase operation when the bit #7 of the data of 8 bits has become "0".

As stated above, during the latency time period of one flash memory, data are written into a different flash memory.

In a semiconductor storage device which includes a plurality of flash memories and which is used for writing continuous data of a plurality of words, the write operation which is of low speed in each flash memory can be quickened for the whole device in accordance with the present invention. More specifically, in a semiconductor disk pack which includes the flash memories, continuous data of a plurality of words are written. In the case of writing continuous data, the operation of writing the data into each flash memory is slow compared with the operation of reading out data therefrom, so that a transfer rate for the whole disk pack is lowered. According to the present invention, however, the data writing speed of the whole disk pack can be increased in spite of the low writing speed of each flash memory.

Figure 1:
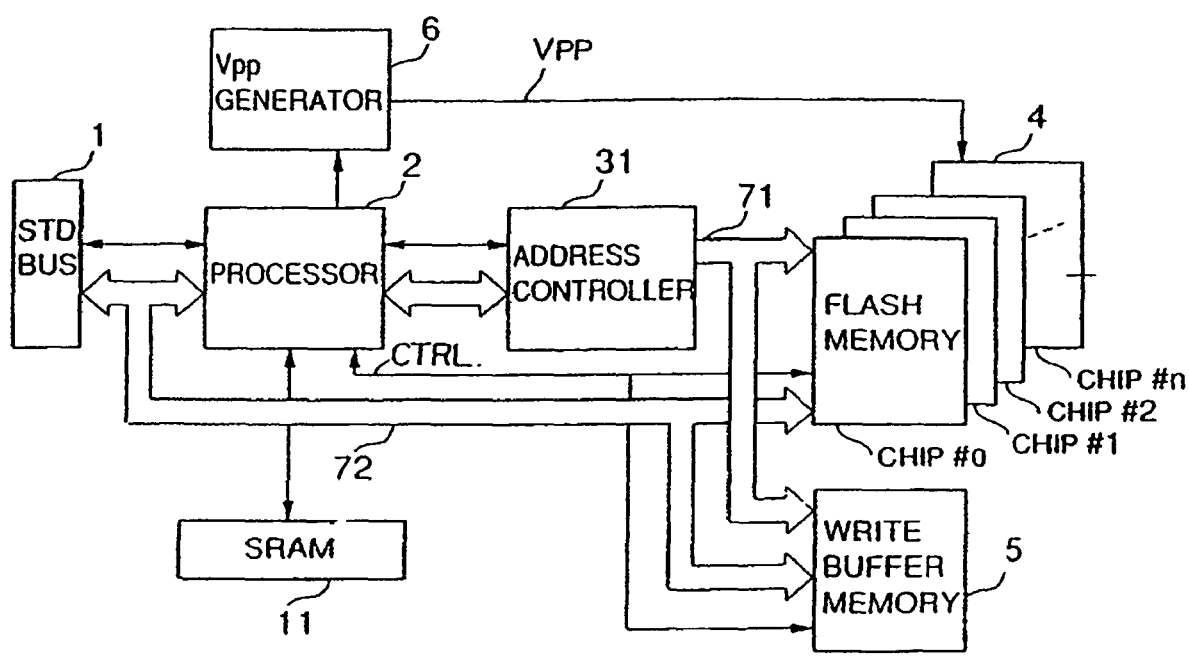
FIG. 1 is a block diagram of a semiconductor disk pack in an embodiment of the present invention.

Now, an embodiment of the present invention will be described in detail with reference to the drawings. FIG. 1 is a block diagram of a semiconductor disk pack which employs a plurality of flash memories. Numeral 1 in the figure indicates the standard bus of a personal computer or the like. The semiconductor disk pack receives and sends commands and data (via data bus 72) from and to an information processing system through the standard bus 1. The bus 1 is not specifically restricted to the type shown, but may be another bus type, such as of the SCSI (Small Computer System Interface) type or that of the local bus of the information processing system, as long as protocols conform to a system which requires an auxiliary storage device. The plurality of flash memories are shown at numeral 4. A write buffer memory 5 serves to temporarily hold data transferred through the standard bus 1. Since the data writing operation of each flash memory 4 is slow compared with the data reading operation thereof, data to-be-written that are transferred through the standard bus 1 are temporarily held in the write buffer memory 5, and the bus mastership of the standard bus 1 is released or transferred to the system side early. In the illustrated embodiment, the write buffer memory 5 is constructed of a static RAM (random access memory). However, the construction of the write buffer memory 5 is not restricted to that of a static RAM, but can be effected by any storage element capable of writing data thereinto at a speed higher than the write speed of the flash memory 4 without regard to whether such storage element is of the volatile or nonvolatile type. Moreover, the write buffer memory 5 need not always be built as a structural component in the semiconductor disk pack. That is, the write buffer memory 5 may be implemented by a part of a data storage area provided on the system side. The write buffer memory 5 has a storage capacity corresponding to a plurality of sectors in units of 512 bytes which is the sector capacity of a standard disk. A processor 2 functions to control the operation of writing data from the write buffer memory 5 into the flash memories 4, via control line CTRL., and to receive and analyze commands and statuses from the standard bus 1. A static random access memory (SRAM) 11, which is controlled by the processor 2, stores therein a conversion table for converting logical sector Nos., which are managed by the system, into physical sector Nos. of those areas of the flash memories 4 into which the data are to be written (regarding logical sector Nos. which are accessed for the first time, the processor 2 creates the conversion table). An address controller 31 generates physical addresses which are the actual addresses of the flash memories 4 and of the write buffer memory 5, and it is controlled by the processor 2. A Vpp generator circuit 6 generates a writing supply voltage Vpp for the flash memories 4, and it has its operation controlled by the processor 2. A memory address bus 71 interconnects the address controller 31, the flash memories 4 and the write buffer memory 5. A data bus 72 connects the standard bus 1 to the processor 2, flash memories 4 and write buffer memory 5.

Figure 2:
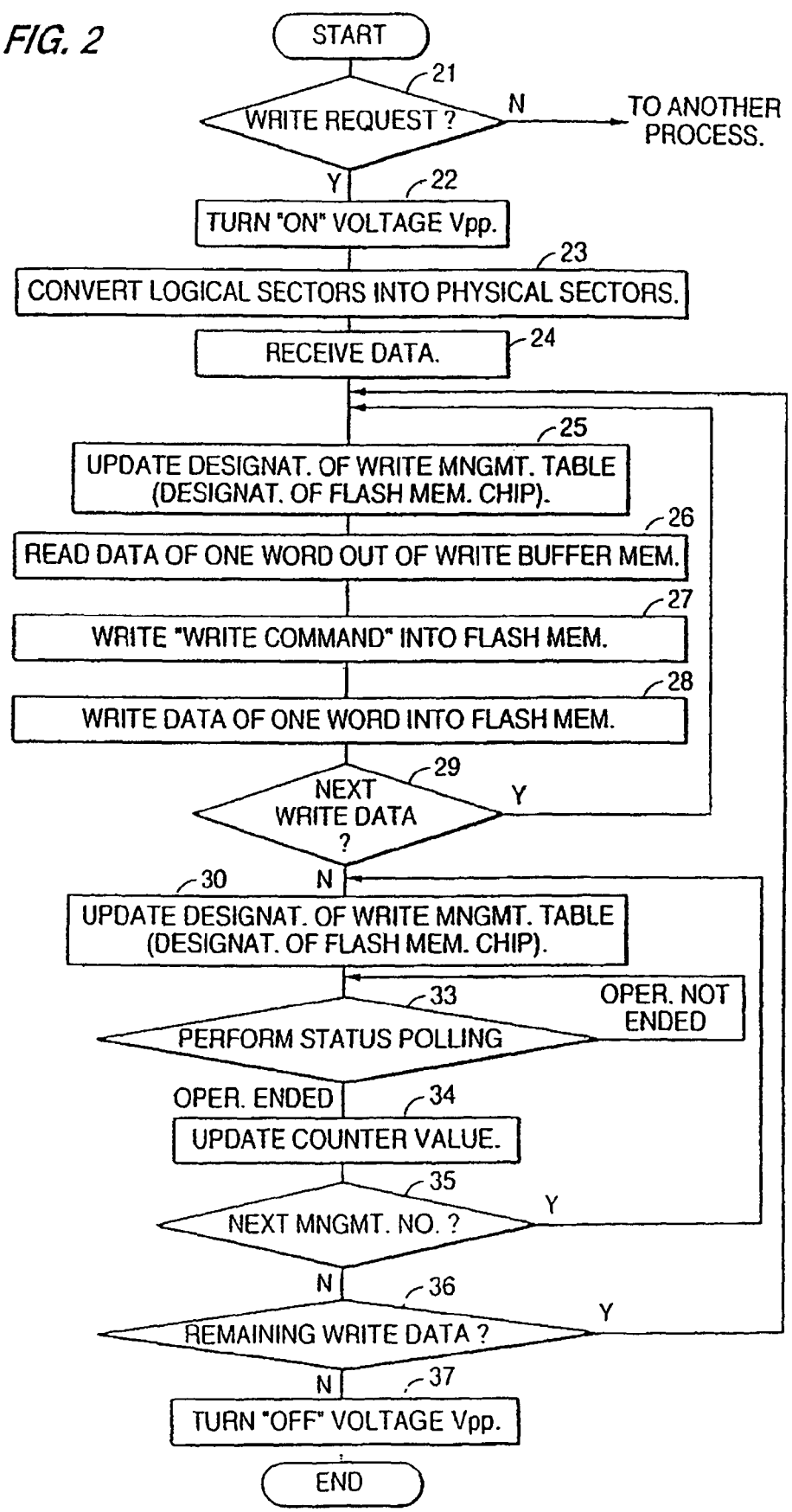
FIG. 2 is a flowchart showing an example of a write operation according to the present invention.

In the semiconductor disk pack constructed as shown in FIG. 1, the write operation which is controlled by the processor 2 is executed as illustrated in the flow chart of FIG. 2. The processor 2 determines if a request for writing data is received from the standard bus 1 (step 21). When the write request is not received, the processor 2 advances to another process. On the other hand, when a write request has been received, the processor 2 actuates the Vpp generator circuit 6 to generate the writing supply voltage Vpp (step 22). Subsequently, the processor 2 converts the logical sector Nos., which are managed by the system and which are delivered from the standard bus 1, into the physical sector Nos. of those areas of the flash memories 4 into which data are to be written (step 23). At this time, the physical sector Nos. are determined so that the data of a plurality of sectors transferred through the standard bus 1 may be distributed among the different chips of the flash memories 4 each of which is adapted to write data in sector units. By way of example, data are assigned in sector units in such a manner that data of one sector initially transferred are assigned to chip #0 of the flash memories 4, while data of one sector subsequently transferred are assigned to chip #1 of the flash memories 4. The determined physical sector Nos. are held in a write management table illustrated in FIG. 3. The write management table exists in the address controller 31. In the illustration of FIG. 3, it is indicated that the data of 3 sectors transferred through the standard bus 1 are held in the blocks #1~#3 of the write buffer memory 5, and that data of one sector in the blocks #1~#3 are respectively written into the sector #3 of the chip #0, the sector #2 of the chip #1 and the sector #7 of the chip #2 of the flash memories 4.

After the write management table has been set, the data of the 3 sectors transferred through the standard bus 1 are received in the three areas of the blocks #1~#3 of the write buffer memory 5 as designated by the write management table (step 24). Then, the semiconductor disk pack releases (i.e., interrupts) the right of access to the standard bus 1, so as to process the operation of writing the data into the flash memories 4 within the disk pack only.

Under this state, the data received in the write buffer memory 5 are written into the flash memories 4. First, the processor 2 selects management No. 0 of the write management table (step 25), whereby the physical addresses of the write buffer memory 5 and the flash memories 4 are delivered to the memory address bus 71. Thus, data of one word are read out of the block #1 of the write buffer memory 5 (step 26), a write command is written into the chip #0 of the flash memories 4 (step 27), and the data of one word read out of the write buffer memory 5 are written into sector #3 of the chip #0 of the flash memories 4 (step 28). At this time, the operation of writing the data is started within the chip #0 of the flash memory 4, but data cannot be read out and written into the chip #0 until the internal write operation ends. The processor 2 determines if there is next write data, i.e. if data exist which are to be written next into the next chip (e.g., chip #1) are existent (step 29). When data to be written next are determined to exist, they are written into another of the flash memory chips 4 during the above latency time period of the chip #0. As stated above concerning the conversion of logical sectors into the physical sectors, data of successive sectors to be written have been assigned to the different chips in sector units. Regarding the data to be written next, the processor 2 designates management No. 1 of the write management table (step 25), and data of one word read out of the block #2 of the write buffer memory 5 are written into the chip #1 of the flash memories 4 (steps 26, 27 and 28). Subsequently, management No. 2 is designated, and the data of one word read out of the block #3 of the write buffer memory 5 are written into sector #7 of the chip #2 of the flash memory 4 (steps 26, 27 and 28).

When data corresponding to one word have been respectively written into the chips #0, #1 and #2 of the flash memories 4 in accordance with steps 26 to 28, and the processor 2 determines the next data is nonexistent in accordance with step 29, the management No. designated by the write management table is updated (step 30). Status polling is performed for the chip #0 of the flash memories 4 which was first subjected to the write operation (step 33), to determine if the write operation within this chip has ended. Also at this time, the processor 2 designates management No. 0 of the write management table is in the write operation, whereby status polling is performed for the chip #0 of the flash memory 4. Here, if the internal write operation of the chip #0 of the flash memory 4 has not ended, the status polling is iterated. On the other hand, if the internal write operation has ended, the counter value of the management No. of the write management table is incremented (step 34). As in the foregoing, the processor 2 determines if the next management No. exists in the write management table (step 35). Since the management No. 1 exists herein, it is designated (step 30), and the status polling is performed for the chip #1 of the flash memory 4 subjected to the data writing operation next to the chip #0 (step 33). If the write operation within the chip #1 of the flash memories 4 has ended, status polling is performed for the chip #2 of the flash memories 4 subjected to the data writing operation next to the chip #1 (step 33). When all of the chips #0~#2 of the flash memories 4 have ended the internal write operations, that is, a condition in which it is determined that the next management No. is nonexistent (step 35), the write sequence proceeds to a step 36.

Here at the step 36, the processor 2 determines if the counter has reached 512 bytes. The state in which the counter has reached 512 bytes signifies that all the data have been written from the buffer memory 5 into the flash memories 4. When the counter has not yet reached 512 bytes, the write operation explained above (steps 25~35) is iterated until the operation of writing the data of 512 bytes has ended. On the other hand, when the counter has reached 512 bytes, that is, when the operation of writing all the data from the write buffer memory 5 into the flash memories 4 has ended, the processor 2 actuates the Vpp generator circuit 6 to stop the generation of the writing supply voltage Vpp (step 37).

As is apparent from the description of this embodiment, data of 3 sectors can be written into the flash memories in a time period which is substantially equal to the writing time period of one sector. Although the operation of writing the 3 sectors is exemplified in the embodiment, it is to be understood that the data of more sectors can be similarly written.

In this embodiment, the flash memories for writing the data in sector units are the separate chips. There is also a method in which 512 bytes within each sector are divided into a plurality of blocks. With this method, data to be written are allocated to different flash memories in divisional block units. By way of example, 512 bytes are divided into 16 blocks in units of 32 bytes. The blocks #1~#16 are respectively written into the different chips of the flash memories. The divisional units of 32 bytes are not restrictive, but 512 bytes may be divided in units in which each is of a desired number of bytes, such as 16 bytes or 64 bytes.

In the embodiment described above, each of the flash memories has a predetermined latency time period determined by the waiting time from completion of the operation of writing the write command and the data of one word until the operation of writing the next data of one word therein begins. It is also possible to employ flash memories each of which is capable of having data written therein in page units, that is, each flash memory can have data of a plurality of words continuously written therein after a page write command is written therein and each of which has a predetermined latency time period associated with each page of data beginning from the time in which data are provided to that flash memory until the end of the operation of writing the data into the designated memory chip within that flash memory. In this case, in the same manner as in the above-described embodiment, the data of one page are written into the first one of the flash memory chips, and the data of another page are written into the second one of the flash memory chips different from the first flash memory chip within the time period which extends from the write operation of the first flash memory chip until the status polling thereof.

The merit of this embodiment is not restricted to the operation of writing the data into the flash memories 4, but it holds true also of the operation of erasing data. The flash memories 4 are erased in chip units, or in block units each consisting of a plurality of words. A method for the erase operation will now be explained. An address indicative of a block to be erased is designated for one of the flash memories 4, while at the same time, an erase command is written into a designated one of the flash memories 4. Thus, an erase process within the flash memories 4 is started. Then, a latency of a predetermined time period is involved until the erase process within the flash memories 4 ends. Meanwhile, the flash memories 4 under the erase process cannot be accessed except for the status polling thereof. When the end of the internal erase process has been acknowledged by the status polling upon the lapse of the predetermined time period, the operation of erasing the next data from the designated one of the flash memories 4 is begun. During the predetermined time period, an erase command is written into another of the flash memories 4 different from the flash memory 4 which is under the erase process. Thus, the plurality of flash memories 4 are erased in parallel. Accordingly, the operation speed for erasing data with respect to the whole semiconductor disk pack is increased.

Figure 4:
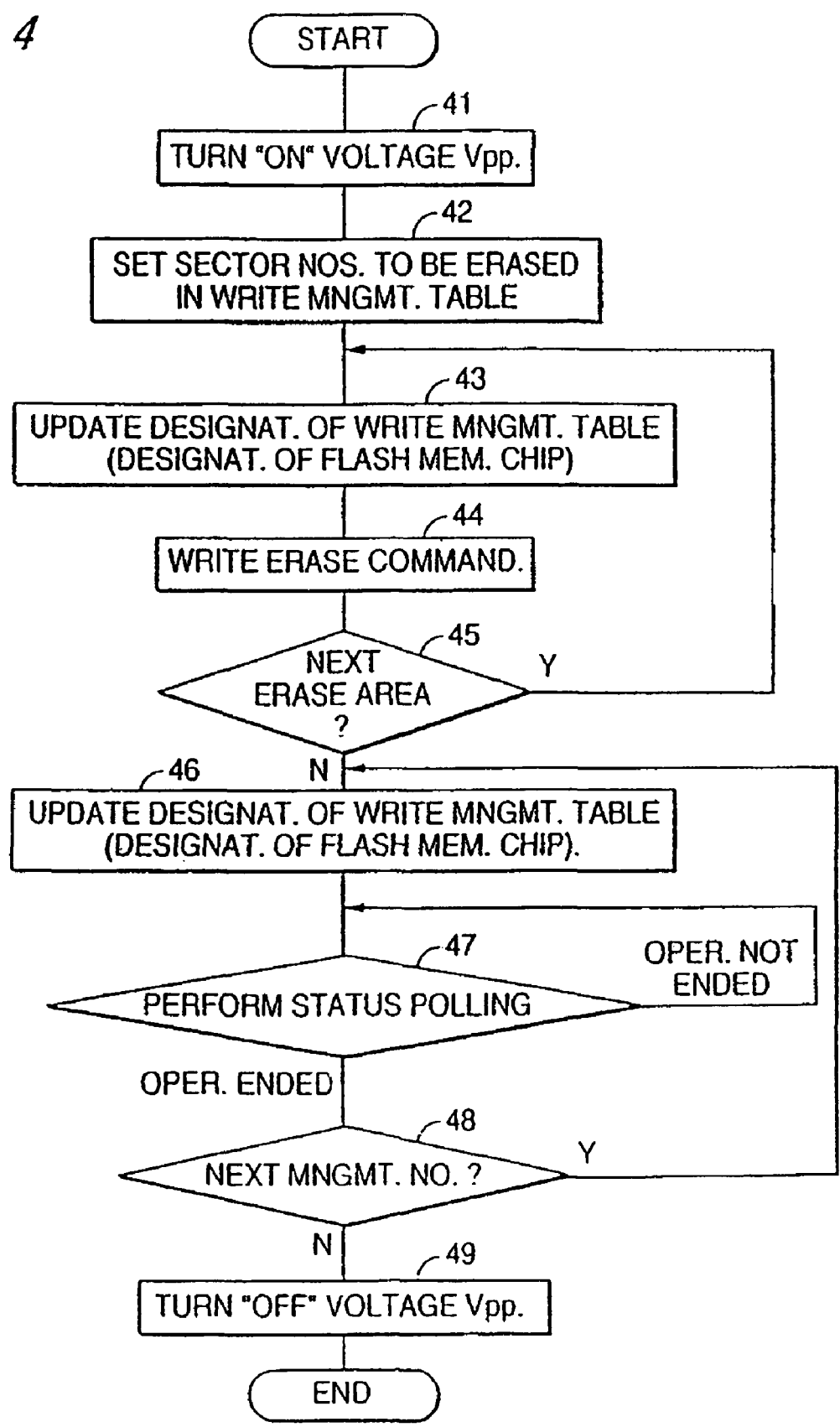
FIG. 4 is a flowchart showing an erase Operation according to the present invention.

The erase operation which the processor 2 controls in the semiconductor disk pack constructed as shown in FIG. 1, is illustrated as a flowchart in FIG. 4. Since the writing supply voltage Vpp needs to be applied also in erasing the flash memories 4, the processor 2 actuates the Vpp generator circuit 6 to generate the writing supply voltage Vpp (step 41). Subsequently, the processor 2 sets the physical sector Nos. of the flash memories 4 to-be-erased in the write management table shown in FIG. 3 (step 42). At this time, areas to-be-erased are set so as to be in different memory chips of the flash memories 4. This embodiment shall refer to a case where the erase unit of each of the flash memories 4 is one sector. After having set the sectors to-be-erased in the write management table, the processor 2 writes erase commands into the respective chips of the flash memories 4 listed in the write management table (step 44) while updating the designation of the flash memory chip in the table (step 43). Subsequently, the processor 2 determines if the next area to-be-erased exists (step 45). When all of the erase commands have been written, the processor 2 updates the designation of the flash memory chip in the table (step 46). Further, the processor 2 executes status polling from the memory chip into which the erase command has been initially written (step 47), to acknowledge if an erase process within the designated one of the flash memories 4 has ended. Subsequently, it determines whether or not the next management No. of the table exists (step 48). If the next management No. exists, the erase sequence returns to the step 46. On the other hand, when the erase processes of all the flash memories 4 have ended, the processor 2 controls the Vpp generator circuit 6 to stop the generation of the writing supply voltage Vpp (step 49).

The previous embodiment has referred to flash memories 4 which erase data in a sector unit. The erase unit, however, differs depending upon flash memories. Therefore, the method of setting the write management table is changed in accordance with the different erase units of the flash memories. In a case where each of the flash memories erases data in terms of chip units, only the column of the chip Nos. of the flash memories may be set in the write management table. In a case where each of the flash memories erases data in terms of plural-word units, the two columns of the chip Nos. and sector Nos. of the flash memories are set in the write management table. However, even with the flash memory which erases data in terms of plural-word units, the data are not always erased in a sector unit. In a case where the flash memory erases the data with the storage capacity of a plurality of sectors as one block, the column of the sector Nos. of the flash memories is set in the write management table, whereby a plurality of sectors are erased.

Figure 5:
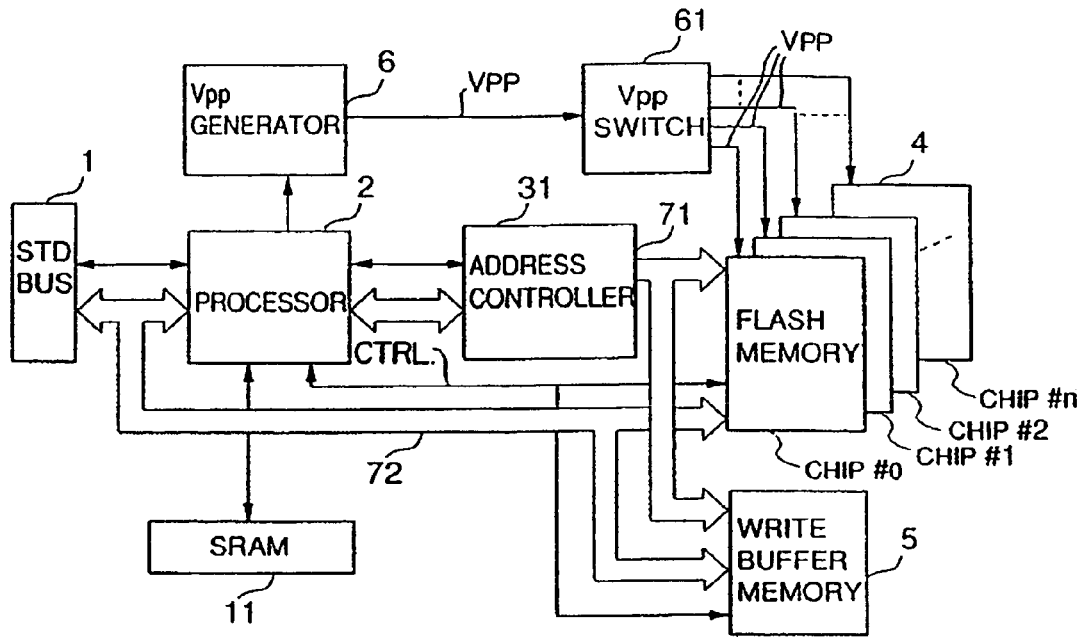
FIG. 5 is a block diagram of a semiconductor disk pack in another embodiment of the present invention.

In the foregoing embodiment, the writing supply voltage Vpp is applied to all the flash memories 4 when it is required in the write or erase operation. There is also a method in which the writing supply voltage Vpp is applied to only the flash memory or those ones of the flash memories 4 into which data are to be written. Such an embodiment of a semiconductor disk pack is illustrated as a block diagram in FIG. 5. Numeral 61 in the figure indicates a switching circuit which selectively applies the writing supply voltage Vpp, generated from the Vpp generator circuit 6, to the flash memories 4. The switching circuit 61 has a plurality of outputs for the writing supply voltage Vpp, and the outputs can be selected under the control of the processor 2. The other components of the semiconductor disk pack, according to FIG. 5, are the same as the similarly numbered components of FIG. 1. When a write request is delivered from the standard bus 1, the processor 2 controls the Vpp generator circuit 6 to generate the writing supply voltage Vpp. Thereafter, the processor 2 converts logical sector Nos. into physical sector Nos. and holds the physical sector Nos. in the write management table shown in FIG. 3. At this time, the processor 2 applies the writing supply voltage Vpp to one or more of the flash memories 4, to have data written thereinto, by designating the corresponding outputs of the Vpp switching circuit 61. It is to be understood that the application of the writing supply voltage Vpp, based on the designation of the outputs of the Vpp switching circuit 61, is done not only in the write operation but, also, in the erase operation in which the flash memories 4 require the writing supply voltage Vpp.

Figure 6:
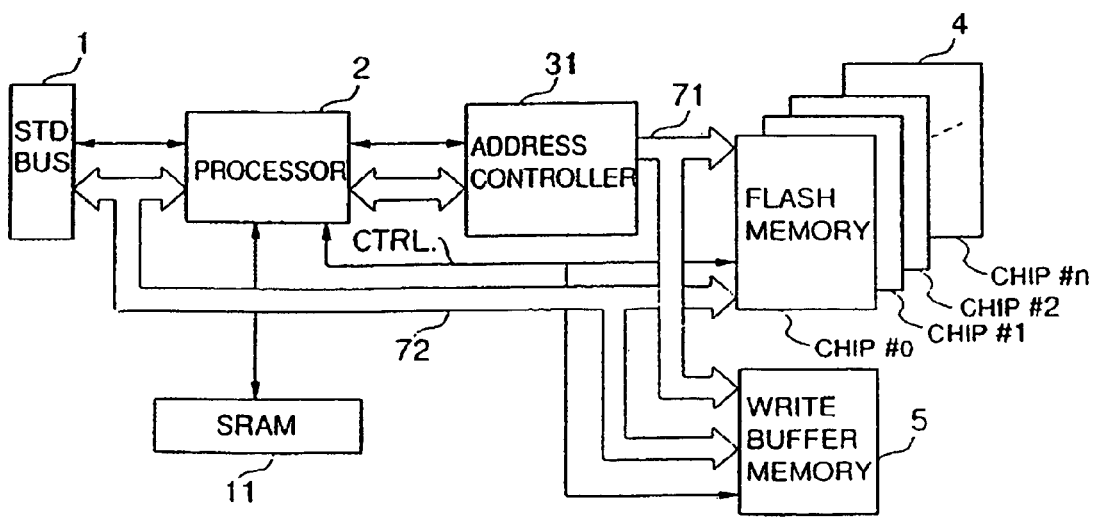
FIG. 6 is a block diagram of a semiconductor disk pack in still another embodiment of the present invention.

The above embodiments are directed to flash memories 4 each of which requires, in both the write and erase operations, a writing supply voltage Vpp which is different (of greater magnitude) than the power supply voltage Vcc. However, certain flash memories suffice with a single supply voltage, that is, they do not require the writing supply voltage Vpp. A semiconductor disk pack directed to such packaged flash memories is illustrated as a block diagram in FIG. 6. The embodiment shown in FIG. 6 has the same construction as in FIG. 1 except that the Vpp generator circuit 6 is not provided. Also, it is to be understood that the steps of turning "on" and "off" the writing supply voltage Vpp are dispensed with in the flowchart of the write operation in FIG. 2 and that of the erase operation in FIG. 4, when applying the same to the embodiment of FIG. 6.

Figure 7:
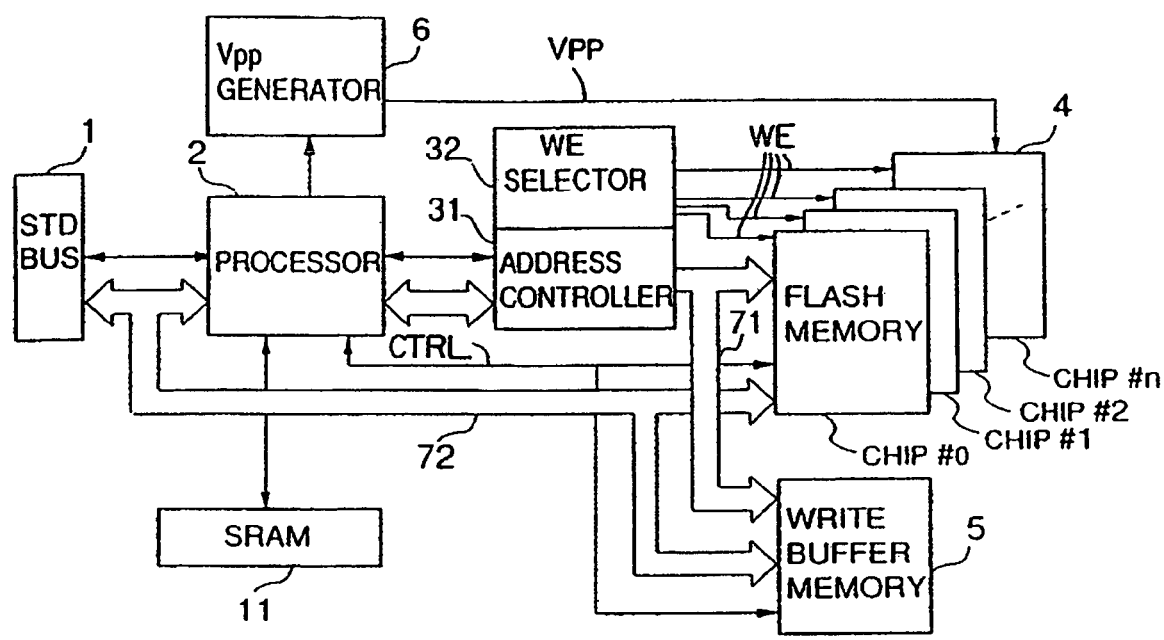
FIG. 7 is a block diagram of a semiconductor disk pack in yet another embodiment of the present invention.
Figure 8:
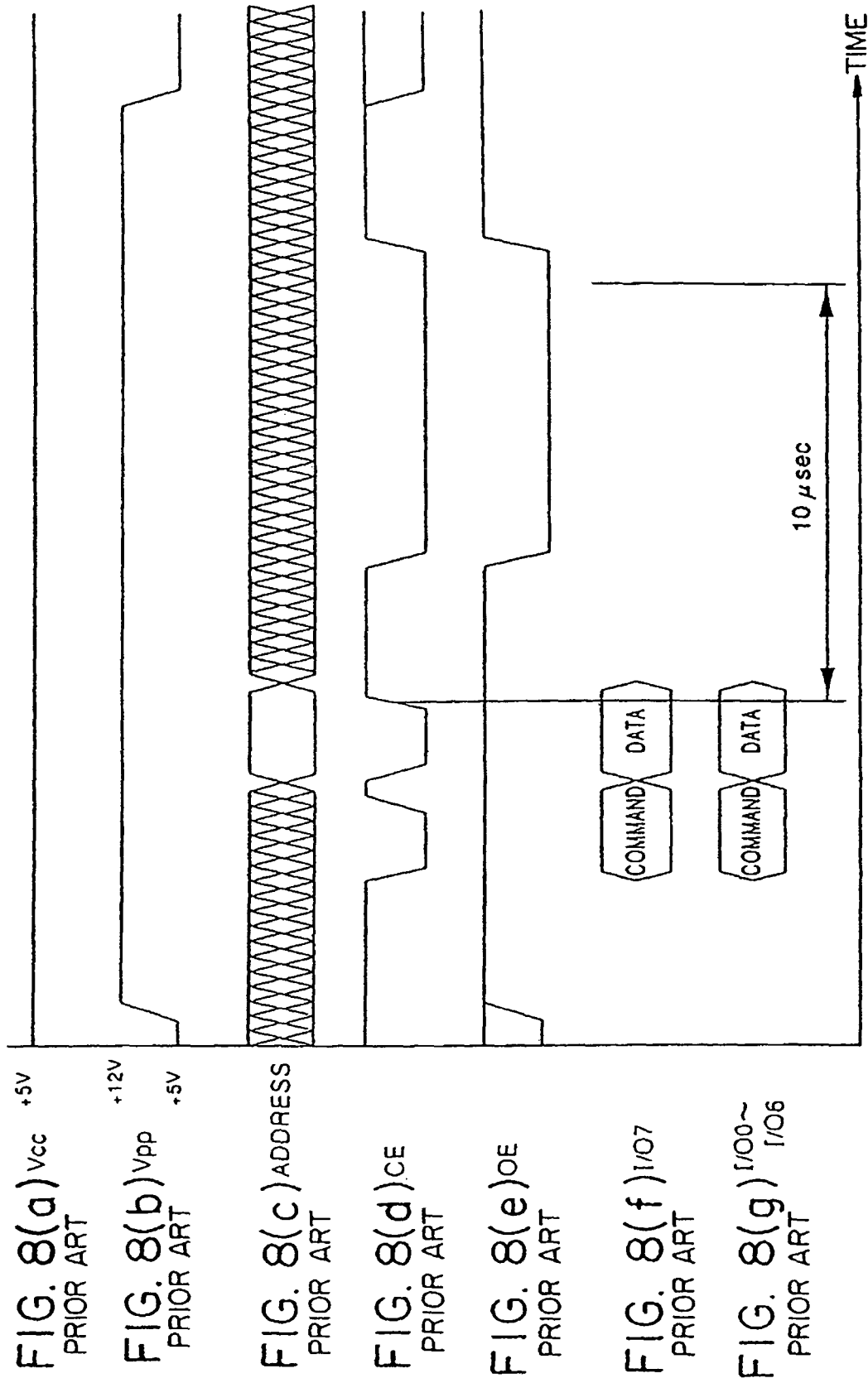
FIGS. 8(a)-8(g) are illustrative of timing signal waveforms which are generated in writing data of one word into a flash memory according to the prior art.

In the above embodiments, the chips of the flash memories 4 into which data are to be written are selected by the chip enable signal CE. There is also a method in which the selection of the flash memories 4, to have data written thereinto, is controlled by a write enable signal WE, not by the chip enable signal CE. A semiconductor disk pack based on this method is illustrated as a block diagram in FIG. 7. Numeral 32 in the figure indicates a WE selector by which the flash memories 4, to have data written thereinto, are selectively supplied with the write enable signal WE. The other components of the semiconductor disk pack, according to FIG. 7, are the same as the similarly numbered components of FIG. 1. The WE selector 32 asserts the write enable signal WE for only those ones of the flash memories 4 which are to be subjected to the write operation. The control of the write operation which is performed by the processor 2 is the same as that shown in the flowchart of FIG. 2.

In another type of disk pack arrangement, certain flash memories are not provided with the write enable signal WE. In case of writing data into such flash memories, the write operation is controlled by controlling the chip enable signal CE and the writing supply voltage Vpp. Even with such flash memories, the present invention can enhance the speed for both the writing of and erasing of data.

Another embodiment will now be described with reference to FIG. 9.

In the embodiment shown in FIG. 2, the status polling of only the specified flash memory chip is iterated at the step 33 until the write operation of this chip ends. In contrast, according to the embodiment shown in FIG. 9, when the status polling of one chip detects that the write operation of the chip has not ended, the status polling of another chip is executed. Thus, the write operation of the whole storage device has its speed raised as will be detailed below.

The flash memory needs to erase the data of a corresponding area before writing data into the area, and it inevitably repeats erase and write operations. The repetition of the erase and write operations degrades the erase and write characteristics of the flash memory, and lengthens time periods required for the erase and write operations. Moreover, the degradations of the erase and write characteristics differ depending upon the chips of the flash memories. That is, some chips are less prone to the degradations of the characteristics in spite of the repeated erase and write operations, whereas others undergo degradations comparatively early. Even in a case where the semiconductor disk pack in any of the foregoing embodiments is constructed including the plurality of flash memories whose characteristics differ in the individual chips, as stated above, the speed of the write operation of the whole pack can be enhanced according to the present invention.

Figure 9:
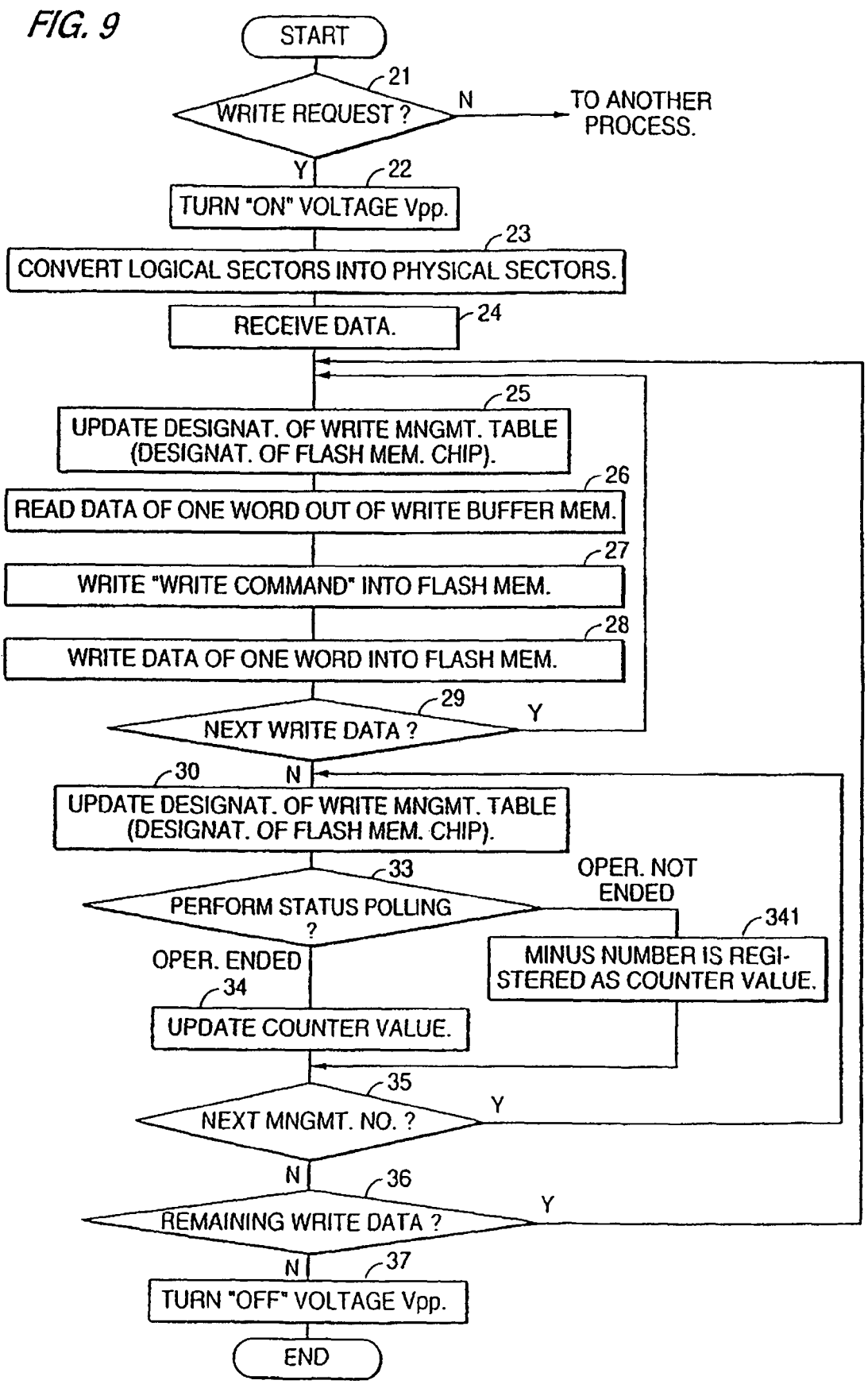
FIG. 9 is a flowchart showing another example of the write operation according to the present invention.

It is supposed in the ensuing explanation that the flash memories of different characteristics coexist in the semiconductor disk pack shown in FIG. 1, and that the write operation which is controlled by the processor 2 conforms to the flowchart of FIG. 9.

Upon receiving a write request from the standard bus 1, the processor 2 receives data transferred through the standard bus 1, which data are temporarily held in the write buffer memory 5 (steps 21, 22, 23 and 24).

The data received in the write buffer memory 5 are respectively written into the chips #0, #1 and #2 of the flash memories 4 in accordance with that listed in the write management table shown in FIG. 3 (steps 25, 26, 27, 28 and 29).

When data of one word have been written into each of the chips #0, #1 and #2 of the flash memories 4 (step 29), the status polling of the flash memory chip #0 initially subjected to the write operation is performed (step 331) to determine if the write operation has ended within the flash memory chip #0. Here, when the write operation within the flash memory chip #0 has not ended, a minus number is registered as the counter value of the management No. 0 in the write management table (step 341). On the other hand, when the write operation has ended, the counter value is incremented (step 34). When a minus number is registered as the counter value in the write management table, the management number can only be incremented after the minus sign is changed into plus. Likewise, the status polling is performed for the chips #1 and #2 of the flash memories 4 (steps 30, 331, 34, 341 and 35). When the status polling has been performed for all the chips of the flash memories 4 subjected to the write operations, the processor 2 then determines if additional data to be written remain (step 36). When such additional data exists, the operation of writing the data is iterated (steps 25, 26, 27, 28 and 29). At this time, when the counter value in the write management table is a minus number, it indicates the chip in which the last status polling showed that the internal write operation of that chip had not ended. Therefore, the additional data are not written into that chip.

The processor 2 determines if the counter has reached 512 bytes, i.e. whether additional data exists which remains to be written (step 36). When the counter has not reached 512 bytes yet or is a minus number, the write operation explained above (steps 25~35) is iterated until the operation of writing the data of 512 bytes has ended. A showing by the counter as having reached 512 bytes for a corresponding chip signifies that the series of data have been written thereinto. Accordingly, the next data can be written into this chip any time.

As is apparent from the description of the embodiment, even when the characteristics of the flash memories packaged in the semiconductor disk pack differ depending upon the chips, the chips of good characteristics complete the data writing operations early and can have the next data written thereinto. Therefore, in case of writing a large amount of data into the flash memories, the write operation speed corresponding to the whole disk pack is increased.

As understood from the above description, the present invention brings forth the effect that, even when flash memories, the write operation of which is slow as compared with the read operation thereof, are incorporated in an auxiliary storage device or the like into which a large amount of data are written, the speed of writing of data with respect to the whole device can be increased. The effect is great especially in a case where a large amount of continuous data are to be written. Moreover, a plurality of areas to be simultaneously erased can be erased at high speed.

Owing to the construction described above, the present invention can provide a semiconductor storage device which shortens a time period for writing data thereinto.

We claim:

1. A semiconductor storage apparatus to be coupled with a system bus to receive a write request accompanied with first and second sectors of data, comprising:
   a plurality of nonvolatile semiconductor memories which store said first and second sectors of data therein; and a control module to be coupled with said system bus, and coupled with said plurality of nonvolatile semiconductor memories, wherein said control module sends a first erase command to one of said plurality of nonvolatile semiconductor memories to initiate a first internal erase operation of data within said one of said plurality of nonvolatile semiconductor memories, wherein, after said first erase command has been sent, said control module sends a second erase command to another of said plurality of nonvolatile semiconductor memories, different from said one of said plurality of nonvolatile semiconductor memories to which said first erase command was sent, to initiate a second internal erase operation of data within said other of said plurality of nonvolatile semiconductor memories while said one of said plurality of nonvolatile semiconductor memories is still performing said first internal erase operation responsive to said first erase command; and wherein the control module operates to send the first and second erase commands to predetermined ones of the nonvolatile semiconductor memories responsive to a management table internal to the control module, wherein the management table is capable of storing entries indicating predetermined portions of a plurality of the nonvolatile semiconductor memories to be subsequently erased, wherein the entries in the management table control the order in which the predetermined portions of the plurality of the nonvolatile semiconductor memories are erased, wherein the entries in the management table are updated in response to completion of each of the first and second internal erase operations.

2. A semiconductor storage apparatus according to claim 1, further comprising:

a buffer memory, coupled commonly with said plurality of nonvolatile semiconductor memories, which holds said first and second sectors of data as write data to be written into said plurality of nonvolatile semiconductor memories, wherein said control module responds to said write request, carries out read operations of said first and second sectors of data as said write data from said buffer memory and carries out write operations of said first and second sectors of data as said write data read out from said buffer memory into said plurality of nonvolatile semiconductor memories, wherein said write operations into said plurality of nonvolatile semiconductor memories are controlled by sending a first write command from said control module to one of said plurality of nonvolatile semiconductor memories and by sending a second write command from said control module to another of said plurality of nonvolatile semiconductor memories, different from said one to which said first write command has been sent, while said one of said plurality of nonvolatile semiconductor memories is still performing a write operation responsive to said first write command.

3. A semiconductor storage apparatus according to claim 2, wherein each of said plurality of nonvolatile semiconductor memories is comprised of a flash memory semiconductor chip.

4. A semiconductor storage apparatus according to claim 2, wherein said buffer memory has a storage memory capacity corresponding to a plurality of sectors in units of 512 bytes which is a sector capacity of a standard disk.

5. A semiconductor storage apparatus according to claim 2, wherein said control module includes a processor.

6. A semiconductor storage apparatus according to claim 5, wherein said control module further includes an address controller.

7. A semiconductor storage apparatus according to claim 2, wherein each of said plurality of nonvolatile semiconductor memories is comprised of a flash memory semiconductor chip, and wherein said buffer memory has a storage memory capacity corresponding to a plurality of sectors in units of 512 bytes which is a sector capacity of a standard disk.

8. A semiconductor storage apparatus according to claim 7, wherein said control module includes a processor.

9. A semiconductor storage apparatus according to claim 8, wherein said control module further includes an address controller.

10. A semiconductor storage apparatus according to claim 2, wherein each of said plurality of nonvolatile semiconductor memories is comprised of a flash memory semiconductor chip, and wherein said buffer memory has a storage memory capacity for storing a plurality of sectors of data.

11. A semiconductor storage apparatus according to claim 10, wherein said control module includes a processor.

12. A semiconductor storage apparatus according to claim 11, wherein said control module further includes an address controller.

13. A semiconductor storage apparatus according to claim 1, wherein each of said plurality of nonvolatile semiconductor memories is comprised of a flash memory semiconductor chip.

14. A semiconductor storage apparatus according to claim 1, wherein said control module includes a processor.

15. A semiconductor storage apparatus according to claim 14, wherein said control module further includes an address controller.

16. A semiconductor storage apparatus to be coupled with a system bus comprising:

a plurality of nonvolatile semiconductor memories which write data from said system therein in sector units and erase said data in block units, said each block including a plurality of said sectors; and a control module to be coupled with said system bus, and coupled with said plurality of nonvolatile semiconductor memories, wherein said control module sends a first erase command to one of said plurality of nonvolatile semiconductor memories to initiate a first internal erase operation of data in said block units within said one of said plurality of nonvolatile semiconductor memories, wherein, after said first erase command has been sent, said control module sends a second erase command to another of said plurality of nonvolatile semiconductor memories, different from said one of said plurality of nonvolatile semiconductor memories to which said first erase command was sent, to initiate a second internal erase operation of data in said block units within said other of said plurality of nonvolatile semiconductor memories while said one of said plurality of nonvolatile semiconductor memories is still performing said first internal erase operation responsive to said first erase command; and wherein the control module operates to send the first and second erase commands to predetermined ones of the nonvolatile semiconductor memories responsive to a management table internal to the control module, wherein the management table is capable of storing entries indicating predetermined portions of a plurality of the nonvolatile semiconductor memories to be subsequently erased, wherein the entries in the management table control the order in which the predetermined portions of the plurality of the nonvolatile semiconductor memories are erased, wherein the entries in the management table are updated in response to completion of each of the first and second internal erase operations.

17. A semiconductor storage apparatus according to claim 16, wherein said control module carries out a status polling operation in an order of said nonvolatile semiconductor memories to which said control module sent said erase commands, after said control module sent said erase commands to all of said nonvolatile semiconductor memories.

* * * * *